(12) United States Patent
Fazelpour et al.

(10) Patent No.: US 6,501,158 B1
(45) Date of Patent: Dec. 31, 2002

(54) STRUCTURE AND METHOD FOR SECURING A MOLDING COMPOUND TO A LEADFRAME PADDLE

(75) Inventors: Siamak Fazelpour, Irvine, CA (US); Roberto U. Villanueva, Irvine, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/599,210

(22) Filed: Jun. 22, 2000

(51) Int. Cl.$^7$ .............................................. H01L 23/495
(52) U.S. Cl. ........................ 257/670; 257/676; 257/666; 257/787
(58) Field of Search ................................ 257/670, 676, 257/666, 787, 674, 675, 669, 796; 438/123, 124, 126, 127; 361/813

(56) References Cited

U.S. PATENT DOCUMENTS

| | | | | |
|---|---|---|---|---|
| 4,701,781 A | * | 10/1987 | Sankhagowit | ................ 257/787 |
| 4,884,124 A | * | 11/1989 | Mori et al. | ................. 257/676 |
| 6,133,634 A | * | 10/2000 | Joshi | ........................... 257/738 |
| 6,281,568 B1 | * | 8/2001 | Glenn et al. | ................. 257/684 |

FOREIGN PATENT DOCUMENTS

| | | | | |
|---|---|---|---|---|
| JP | 1-205454 | * | 8/1989 | ................ 257/667 |
| JP | 4-320055 | * | 11/1992 | ................ 257/666 |

* cited by examiner

Primary Examiner—Jasmine J B Clark
(74) Attorney, Agent, or Firm—Farjami & Farjami LLP

(57) ABSTRACT

Structure and method for securing a molding compound to a leadframe paddle is disclosed. Half-holes are etched in the top surface of the leadframe paddle. Moreover, each side of the leadframe paddle is provided with a respective anchor. A die is then attached to the top surface of the leadframe paddle. During the molding process, the molding compound covers the die, the anchors, and fills the half-holes in the top surface of the leadframe paddle. The half-holes cause the molding compound to be locked into the paddle. The half-holes also increase the interface surface area between the molding compound and the top surface of the leadframe paddle. Moreover, during the molding process, the molding compound will encapsulate the anchors provided on each side of the die. When the molding compound hardens around the anchors, the molding compound is reinforced and held in place by the anchors. In essence, the anchors act as supports that extend in four directions within the molding compound to hinder both upward and downward movement of the molding compound. Accordingly, the half-holes and anchors result in a better adhesion of the molding compound to the top surface of the leadframe paddle.

18 Claims, 2 Drawing Sheets

STRUCTURE AND METHOD FOR SECURING A MOLDING COMPOUND TO A LEADFRAME PADDLE

BACKGROUND OF THE INVENTION

1. Field of the Invention

The present invention is generally in the field of semiconductor packaging. More specifically, the invention is in the field of leadframe packaging.

2. Background Art

A leadframe is used in the fabrication of plastic molded enclosures, also referred to as a "molded package" in this application. The leadframe is fabricated from a metal such as copper and comprises a paddle which is secured to the body of the leadframe by four tie-bars. The paddle is situated at the center of the leadframe. The leadframe also comprises a number of leads which are secured to the frame.

A die is attached to the top surface of the paddle in a manner known in the art. Respective first ends of respective bond wires are then bonded to respective die bonding pads. Respective second ends of each bond wire are then spanned to respective inner leads in the leadframe and bonded thereto for making the desired electrical connections. In a subsequent stage of the assembly process, the leadframe is placed in a mold cavity in a transfer molding machine and the entire die, bond wires, die bonding pads, and top surface of the paddle are encapsulated in a molding compound.

In an "exposed" paddle leadframe based molded package, the bottom of the paddle is not encapsulated in molding compound. The metal on the bottom of the paddle of the leadframe is left exposed in order to attach the bottom of the paddle to the printed circuit board during a re-flow solder process.

The top surface of the paddle is usually silver-plated copper, while the exposed copper bottom of the paddle is usually left unplated. Typical molding compounds have poor adhesion to silver. Therefore, the typical molding compound adheres poorly to the top of the paddle. As a result, most of the protection against separation of the molding compound from the top of the paddle is provided by the four edges along the sides of the paddle. However, the protection provided by the edges of the paddle against separation of the molding compound from the top of the paddle is usually insufficient. Therefore, separation of the molding compound from the top of the paddle may still occur.

It is known in the field of leadframe packaging that poor adhesion of the molding compound to the paddle of the leadframe in an exposed paddle leadframe based molded package is a serious concern. As discussed above, poor adhesion of the molding compound to the silver-plated top of the paddle and insufficient adhesion along the edges of the paddle may result in the separation of the molding compound from the surface of the paddle of the leadframe. This separation is generally referred to as "delamination."

Delamination can occur during the re-flow process when the bottom of the paddle is soldered to the printed circuit board. The exposed bottom of the paddle is brought into contact with solder on the surface of the printed circuit board. The solder is heated to a temperature of approximately 120 degrees centigrade. At approximately this temperature, the solder becomes molten and the bottom of the paddle of the leadframe is then brought into contact with the molten solder. When the solder cools, a secure connection of the paddle to the printed circuit board will result.

However, there are problems with this process. During the re-flow process, as the temperature rises, a point is reached where the temperature is not yet high enough for the solder to melt, but is high enough to result in an expansion of the copper bottom of the paddle. Because the top of the paddle is encapsulated in molding compound, some support for the paddle in the upward direction is provided. This support on top of the paddle hinders any upward expansion. However, the bottom of the paddle is not encapsulated. As a result, the paddle expands primarily in a downward direction. Because the molding compound has some support from the top and edges of the paddle it tends to stay fixed as the bottom of the paddle pulls downward. This downward expansion of the paddle and the essentially fixed position of the molding compound can lead to a separation of the top surface of the paddle from the molding compound.

One effect of delamination is that the bond wires may be broken. A first end of each bond wire is bonded to a die bonding pad on the die. As discussed above, the die is attached to the top surface of the paddle. The bond wires bonded to the die are encapsulated in the molding compound during the molding process. As stated above, the molding compound tends to stay fixed as the paddle expands downward. Therefore, the bond wires also stay fixed. Thus, in response to the paddle being pulled downward, the bond wires may break. As a result of the problem described above, there are many unusable molded packages in the leadframe assembly process which cause a significant decrease in the yield.

Thus, it is seen that there is a need in the art for a method of providing better adhesion between the molding compound and the top of the paddle in an exposed leadframe based molded package.

SUMMARY OF THE INVENTION

The present invention is structure and method for securing a molding compound to a leadframe paddle. According to the invention's structure and method, improved adhesion between the molding compound and the top surface of the leadframe paddle in an exposed leadframe based molded package is achieved.

According to the invention, half-holes are etched in the top surface of the leadframe paddle. Moreover, according to the invention, each side of the leadframe paddle is provided with a respective anchor. A die is then attached to the top surface of the leadframe paddle. During the molding process, the molding compound covers the die, the anchors, and fills the half-holes in the top surface of the leadframe paddle. The half-holes cause the molding compound to be locked into the paddle. The half-holes also increase the interface surface area between the molding compound and the top surface of the leadframe paddle.

Moreover, during the molding process, the molding compound will encapsulate the anchors provided on each side of the die. When the molding compound hardens around the anchors, the molding compound is reinforced and held in place by the anchors. In essence, the anchors act as supports that extend in four directions within the molding compound to hinder both upward and downward movement of the molding compound. Accordingly, the invention's half-holes and anchors result in a better adhesion of the molding compound to the top surface of the leadframe paddle.

DETAILED DESCRIPTION OF THE INVENTION

The present invention is structure and method for securing a molding compound to a leadframe paddle. The following description contains specific information pertaining to different types of materials, layouts, dimensions, and implementations of the invention. One skilled in the art will recognize that the present invention may be practiced with materials, layouts, dimensions, and implementations different from those specifically discussed in the present application. Moreover, some of the specific details of the invention are not discussed in order to not obscure the invention. The specific details not discussed in the present application are within the knowledge of a person of ordinary skills in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1A:
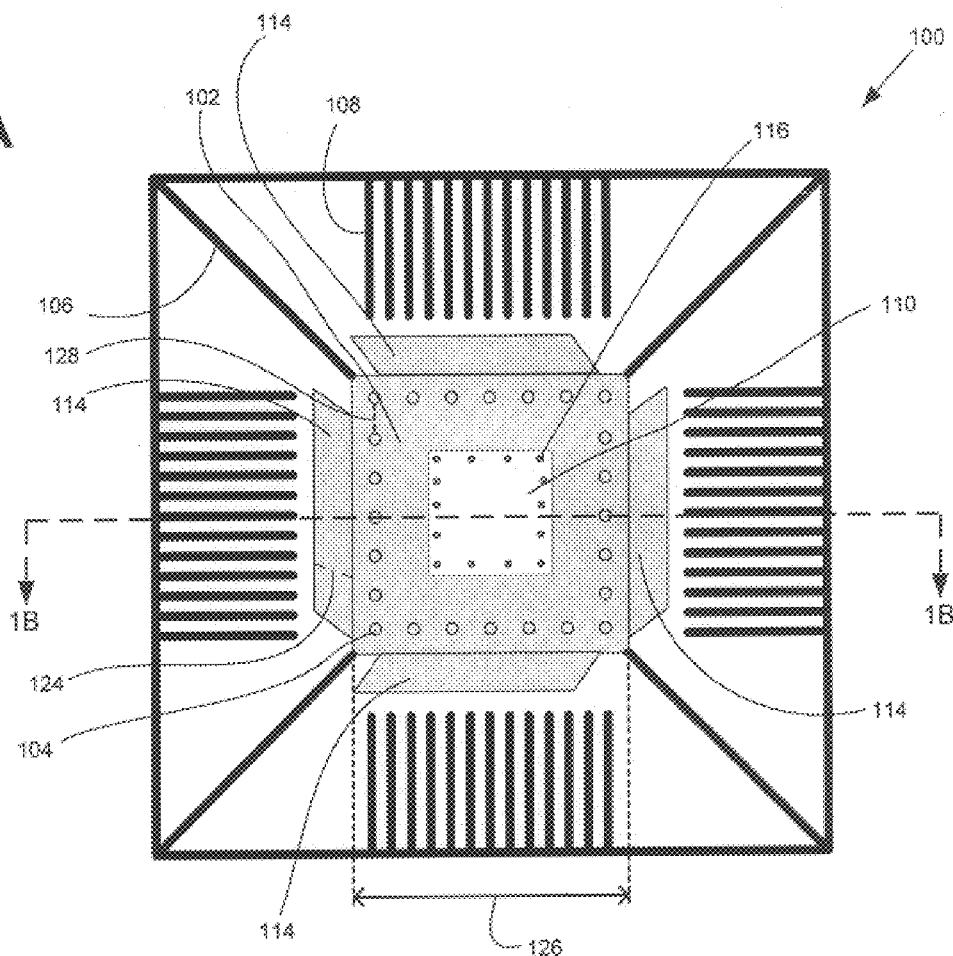
FIG. 1A illustrates a perspective view of the invention's structure, including a leadframe paddle, half-holes, and anchors.

FIG. 1A shows a perspective view of one embodiment of the present invention. In this embodiment, leadframe 100 is a deep downset leadframe. In a deep downset leadframe, the paddle, referred to by numeral 102, is not on the same horizontal plane as tie-bars 106 and inner leads 108 of the leadframe, but is instead set down at a lower level than the rest of the leadframe. In the present embodiment, a semiconductor die, referred to by numeral 110, is attached to the top surface of paddle 102. After semiconductor die 110 is attached to paddle 102, bond wires (not shown in any of the FIGS.) are bonded between the semiconductor die and the leadframe. The bond wires can be gold or aluminum. Each bond wire (the bond wires are not shown in any of the FIGS.) has a first end bonded to a die bonding pad referred to generally by numeral 116. A second end of each bond wire would be bonded to a respective inner lead 108 of leadframe 100. It is noted that leadframe 100 also comprises outer leads which are not shown in any of the FIGS.

Paddle 102 is connected to the leadframe 100 by four tie-bars referred to generally by numeral 106. There is one tie-bar 106 at each corner of paddle 102. In this embodiment, tie-bars 106 and inner leads 108 can be copper. The top side of paddle 102 can be silver-plated copper, while the bottom side of paddle 102 is uncoated copper. Die bonding pads 116 can be aluminum. In FIG. 1A, leadframe 100 has not yet been through the molding process, thus leadframe 100 remains unencapsulted in molding compound.

From the perspective view of the invention shown in FIG. 1A, it is seen that paddle 102 has been bent upward along its four sides to form what is referred to as "anchors" 114 in the present application. These anchors are not shown to scale; they are shown out of proportion in order to enhance clarity. As an example, the width of anchors 114, referred to by numeral 124, can be approximately 5 percent of the width of paddle 102, referred to by numeral 126.

It can also be seen that "half-holes" referred to generally by numeral 104, have been fabricated on the top surface of paddle 102. Half-holes 104 are not "through-holes" since they do not pierce paddle 102, and as such they are referred to as "half-holes" and not "holes." The depth of each one of half-holes 104 can be approximately one-half the thickness of paddle 102. Half-holes 104 can be etched into paddle 102 during the fabrication of leadframe 100. As an example, the diameter of each one of half-holes 104 can be four mils (one mil is equal to one thousandth of an inch). The pitch between half-holes 104, referred to by numeral 128, can be twenty mils. The function of the invention's anchors 114 and half-holes 104 will be discussed in detail below in relation to FIG. 1B.

Figure 1B:
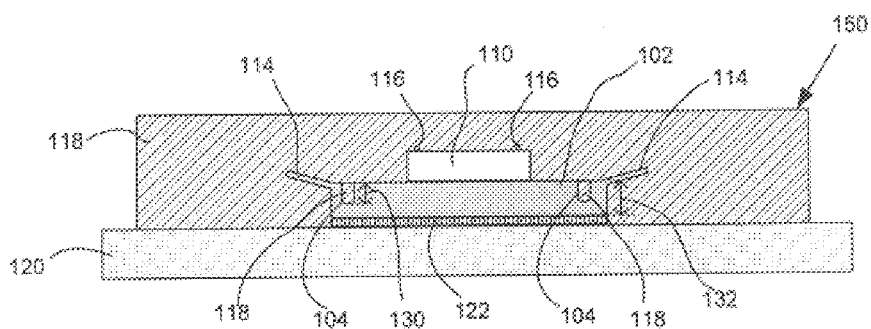
FIG. 1B illustrates a cross section view of the invention's structure, including a leadframe paddle, half-holes, and anchors.

FIG. 1B shows a cross section of leadframe 100 at a later stage in the assembly process after leadframe 100 has been incorporated into molded package 150. The cross TO section of leadframe 100 shown in FIG. 1B is taken across the line 1B in FIG. 1A.

During the molding process, leadframe 100 is placed in a mold cavity in the molding machine. The mold machine closes and clamps to seal the mold cavity. The mold cavity is then transfer filled with molding compound 118. Molding compound 118 penetrates the mold cavity to completely encapsulate leadframe 100. Molding compound 118 surrounds molded package 150 to provide protection from contamination and physical damage in subsequent manufacturing processes and while the completed molded package is in use. In the present embodiment of the invention, molding compound 118 can be Sumitomo 7720, Sumitomo 7730 or Plaskon SMT-B-1.

During the process where molding compound 118 is applied to leadframe 100, the bottom of paddle 102 is protected from encapsulation. Molding compound 118 is in a high temperature liquid state when it is applied to leadframe 100 and is forced around semiconductor die 110, die bonding pads 116, inner leads 108 (not shown in FIG. 1B), and paddle 102, including anchors 114 along the sides of paddle 102. Molding compound 118 is also forced into half-holes 104 and fills them up. Molding compound 118 hardens during a curing cycle. The mold clamp opens after the curing cycle and ejects leadframe 100.

Thus, during the molding process, as leadframe 100 is being encapsulated, half-holes 104 are completely filled with molding compound 118. The result of this molding process is shown in FIG. 1B, where half-holes 104 on paddle 102 within molded package 150 are shown completely filled with molding compound 118.

Molded package 150 has been soldered to a printed circuit board, referred to by numeral 120. The inner and outer leads of molded package 150 are not shown in FIG. 1B. It is noted that inner leads 108 (not shown in FIG. 1B), would be connected to the outer leads of molded package 150 (not shown in any of the FIGS.). The outer leads of molded package 150 would in turn be attached to printed circuit board 120 to make the desired electrical connections.

As stated above, molded package 150 is attached to printed circuit board 120 by solder. This solder is referred to by numeral 122. The molding compound, referred to by numeral 118, completely encapsulates semiconductor die 110, die bonding pads 116, and the top surface of paddle 102, including anchors 114 along the sides of paddle 102. The bottom surface of paddle 102 was left exposed after the molding process, i.e. it was not encapsulated by molding compound 118. This bottom surface of paddle 102 is situated on top of, and is connected to, printed circuit board 120 by solder 122.

As discussed above, the cross section view of FIG. 1B shows that the depth of half-holes 104, referred to by numeral 130, is approximately one-half the depth of paddle 102, referred to by numeral 132. It can also be seen that during the molding process half-holes 104 were completely filled with molding compound 118. It is noted that in an exposed leadframe based molded package, through-holes can not be made in the exposed paddle because the inside of the molded package would then be exposed to moisture and contamination, which would enter through the holes on the bottom side of the paddle. Thus, the use of through holes in the paddle to provide better adhesion to the molding compound is not an option in an exposed paddle leadframe based molded package.

According to the invention, half-holes 104 are etched to approximately one-half the depth of paddle 102. By ensuring that half-holes 104 do not reach the bottom of paddle 102, the invention ensures that moisture or contamination are unable to enter the molded package through half-holes 104. As discussed above, during the molding process, these half-holes are filled with molding compound 118. After molding compound 118 hardens, molding compound 118 within half-holes 104 act as plugs to provide greater adhesion of molding compound 118 to the silver-plated top surface of paddle 102.

Figure 2:
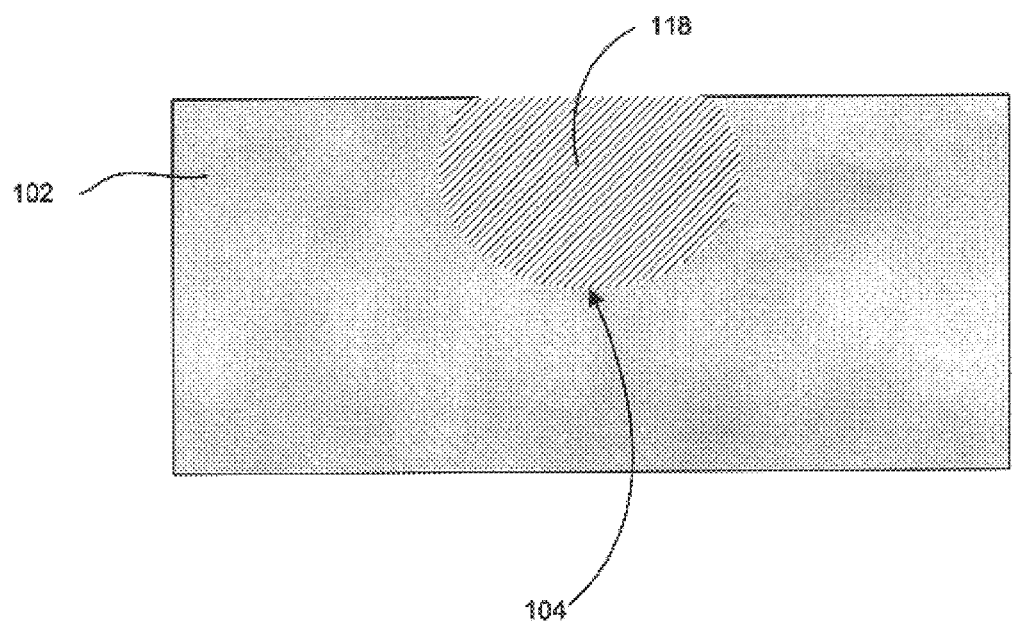
FIG. 2 illustrates a cross section view of a half-hole filled with a molding compound.

FIG. 2 shows one of the invention's half-holes 104 etched in paddle 102 and filled with molding compound 118. An isotropic etch should be used when etching half-holes 104 to etch the top side of paddle 102 in both a downward direction and to the sides, as shown in FIG. 2. As can be seen from FIG. 2, the isotropic etch allows molding compound 118 to be more firmly "locked" into paddle 102 by allowing molding compound 118 to spread out in a lateral direction under the top surface of paddle 102. Therefore molding compound 118 within half-holes 104 has a greater "plugging" effect which significantly increases the overall adhesion of molding compound 118 to the top surface of paddle 102 provided by half-holes 104.

In addition, the walls of half-holes 104 provide an increased surface area on which molding compound 118 can adhere. This increase in the surface area where adhesion takes place results in a stronger overall adhesion of molding compound 118 to the top surface of paddle 102.

As discussed above, in addition to half-holes 104, the invention adds anchors 114 to paddle 102. Referring again to FIG. 1B, it can be seen that anchors 114 are folded up from the sides of paddle 102. Anchors 114 protrude outward from the sides of paddle 102 at an upward angle. During the molding process, the mold will encapsulate anchors 114. When molding compound 118 hardens around anchors 114, a structure is created whereby molding compound 118 is reinforced and held in place by anchors 114. In essence, anchors 114 act as supports that extend in four directions within molding compound 118 to hinder both upward and downward movement of molding compound 118.

As discussed above, during the re-flow process solder 122 will be heated to a temperature of 120 degrees centigrade. Before this temperature has been reached, the bottom of paddle 102 will begin to expand in a downward direction. However, as a result of the invention, molding compound 118 will have significantly better adhesion to the top surface of paddle 102. This increase in adhesion of molding compound 118 to the top surface of paddle 102 is created by the plugging effect described above along with the extra support of anchors 114 within molding compound 118. Thus, molding compound 118 will successfully resist separation from paddle 102 during the solder re-flow process and molded package 150 will be soldered to printed circuit board 120 intact. Thus, the yield of the leadframe assembly process will increase significantly.

It is seen that the invention provides better adhesion between the molding compound and the top of the paddle in an exposed leadframe based molded package by etching half-holes in the top of the leadframe paddle. In addition, extra support is provided for the molding compound by having anchors at the four sides of the paddle which extend at an upward angle away from the paddle and hinder the movement of the molding compound.

Thus, structure and method for securing a molding compound to a leadframe paddle have been described.

What is claimed is:

1. A structure comprising:
   a leadframe paddle having a top surface and a bottom surface;
   a half-hole etched in said top surface of said leadframe paddle;
   an anchor along a side of said top surface of said leadframe paddle, wherein said anchor is formed by bending said side of said leadframe paddle;
   a die attached on said top surface of said leadframe paddle;
   a molding compound covering said half-hole, said anchor, and said die, said molding compound not covering said bottom surface of said leadframe paddle.

2. The structure of claim 1 wherein said top surface of said leadframe paddle to comprises silver.

3. The structure of claim 1 wherein said half-hole is etched to a first depth, said first depth being equal to approximately one half of a thickness of said leadframe paddle.

4. The structure of claim 1 wherein a width of said anchor is equal to approximately five percent of a width of said leadframe paddle.

5. The structure of claim 1 wherein said molding compound is selected from the group consisting of Sumitomo 7720, Sumitomo 7730, and Plaskon SMT-B-1.

6. The structure of claim 1 wherein said die is a semiconductor die comprising silicon.

7. A structure comprising:
   a leadframe paddle having a top surface defining a first plane and a bottom surface;
   an anchor formed on a side of said top surface of said leadframe paddle, wherein said anchor is formed by bending said side of said leadframe paddle away from said first plane of said top surface;
   a die attached to said top surface of said leadframe paddle; and
   a molding compound covering said die and said anchor, said anchor increasing adhesion of said molding compound to said leadframe paddle, said molding compound not covering said bottom surface of said leadframe paddle.

8. The structure of claim 7 further comprising a half-hole etched in said top surface of said leadframe paddle.

9. The structure of claim 7 wherein said top surface of said leadframe paddle comprises silver.

10. The structure of claim 7 wherein a width of said anchor is equal to approximately five percent of a width of said leadframe paddle.

11. The structure of claim 7 wherein said molding compound is selected from the group consisting of Sumitomo 7720, Sumitomo 7730, and Plaskon SMT-B-1.

12. The structure of claim 7 wherein said die is a semiconductor die comprising silicon.

13. The structure of claim 8 wherein said half-hole is etched to a first depth, said first depth being equal to approximately one half of a thickness of said leadframe paddle.

14. A structure comprising:
   a leadframe paddle having a top surface and a bottom surface;

a half-hole on said top surface of said leadframe paddle;

a die attached to said top surface of said leadframe paddle; and a molding compound covering said die and filling said half-hole, said half-hole increasing adhesion of said molding compound to said leadframe paddle, said molding compound not covering said bottom surface of said leadframe paddle.

15. The structure of claim 14, wherein said half-hole is substantially isotropic.

16. The structure of claim 14, wherein said half-hole is etched to a first depth, said first depth being equal to approximately one half of a thickness of said leadframe paddle.

17. The structure of claim 14, wherein said molding compound is selected from the group consisting of Sumitomo 7720, Sumitomo 7730, and Plaskon SMT-B-1.

18. The structure of claim 14, wherein said die is a semiconductor die comprising silicon.

* * * * *